United States Patent [19]

Lee et al.

[11] Patent Number: 5,414,308
[45] Date of Patent: May 9, 1995

[54] HIGH FREQUENCY CLOCK GENERATOR WITH MULTIPLEXER

[75] Inventors: I-Shi Lee, Taipei; Tim H. T. Shen, Tao-Yuan; Stephen R. M. Huang; Judy C. L. Kuo, both of Hsin Chu, all of Taiwan, Prov. of China

[73] Assignee: Winbond Electronics Corporation, Hsinchu, Taiwan, Prov. of China

[21] Appl. No.: 921,889

[22] Filed: Jul. 29, 1992

[51] Int. Cl.⁶ .......................... H03L 7/00; H03B 1/04
[52] U.S. Cl. ........................................ 327/293; 331/46; 331/49; 331/56; 327/291; 327/295; 327/296; 327/407
[58] Field of Search ........................ 328/61, 62, 63, 72, 328/137, 104, 154; 307/269, 241, 243, 271; 331/162, 49, 46, 54, 56

[56] References Cited

U.S. PATENT DOCUMENTS

| | | | |
|---|---|---|---|
| 3,594,656 | 7/1971 | Tsukamoto | 331/54 |
| 4,199,726 | 4/1980 | Bukosky et al. | 328/61 |
| 5,066,868 | 11/1981 | Doty, II et al. | 328/61 |
| 5,099,141 | 3/1992 | Utsunomiya | 328/137 |
| 5,122,677 | 6/1992 | Sato | 328/137 |
| 5,122,757 | 6/1992 | Weber et al. | 328/61 |
| 5,136,180 | 8/1992 | Caviasca et al. | 328/137 |
| 5,144,254 | 9/1992 | Wilke | 307/271 |
| 5,151,613 | 9/1992 | Satou et al. | 328/61 |
| 5,179,348 | 1/1993 | Thompson | 307/271 |
| 5,231,389 | 7/1993 | Yamauchi | 331/46 |
| 5,254,960 | 10/1993 | Hikichi | 331/46 |

*Primary Examiner*—Timothy P. Callahan
*Assistant Examiner*—Trong Phan
*Attorney, Agent, or Firm*—Skjerven, Morrill, MacPherson, Franklin & Friel; Alan H. MacPherson

[57] ABSTRACT

A high frequency clock generator has a plurality of quartz crystals capable of providing various output frequencies coupled to multiple oscillator circuits. The output line from each oscillator circuit is coupled to one or more multiplexers so that the user can select one or more output frequencies at the same time. The multiple clock oscillator circuits and the multiplexer(s) are fabricated as an integrated circuit to minimize the degrading effects of weather and dust, to provide a fixed capacitive value and inverter bandwidth product, and to improve clock generator stability.

15 Claims, 6 Drawing Sheets

HIGH FREQUENCY CLOCK GENERATOR WITH MULTIPLEXER

FIELD OF THE INVENTION

The present invention relates to a high frequency clock generator, and particularly to a high frequency clock generator with a multiplexer.

BACKGROUND OF THE INVENTION

A conventional, single-frequency clock generator is shown in FIG. 1A. In this clock generator, a crystal $X_{L1}$ which is capable of oscillation generally utilizes quartz as a piezoelectric element, i.e., an element in which strain generates a voltage and vice-versa. Hence, an electric field applied to the crystal generates acoustic waves in the crystal which, in turn, provide a voltage at the surface of the crystal. This crystal, with appropriate contacts formed thereon (typically by plating), forms an RLC circuit which can be pretuned to a particular frequency.

As shown in FIG. 1A, crystal $X_{L1}$ is connected in parallel with resistor $R_f$ and inverter $A_1$, and in series with capacitors $C_i$ and $C_o$. Inverter $A_1$ provides the voltage source that initiates oscillation. Assuming node 34 has a low voltage, inverter $A_1$ provides a high voltage on node 31. This high voltage charges capacitor $C_o$ and causes a current to flow through resistor $R_f$ to node 34. The magnitude of this current depends upon the value of resistor $R_f$ and the voltage difference between node 31 and node 34. The voltage on node 34 increases as capacitor $C_i$ stores charge. When the voltage on node 34 reaches a certain level, the output voltage from inverter $A_1$ on node 31 changes from high to low, causing capacitor $C_o$ to discharge. Quartz crystal $X_{L1}$, after reaching its resonant frequency, stabilizes the oscillator generator circuit 32 at that frequency. The charging/discharging of capacitors $C_o$ and $C_i$ transforms the clear high or low voltage at node 31 provided by inverter $A_1$ into intermediate voltages. Therefore, to ensure that the output line 33 provides a clear high or low voltage, inverter $A_2$ is included in the oscillator generator circuit 32.

During high frequency oscillation, i.e. 20 MHz or higher, the above device is limited by the physical characteristics of the inverters $A_1$, $A_2$ and the quartz crystal $X_{L1}$. Specifically, if the gain bandwidth product of the inverters $A_1$, $A_2$ is insufficiently large, inverters $A_1$, $A_2$ are unable to generate the needed oscillation frequencies. Moreover, if the stability of quartz crystal $X_{L1}$ is insufficient (for example, an inadequate gain of inverter $A_1$ may cause the phase of oscillation of quartz crystal $X_{L1}$ to fail to reach a full 360°, or an inadequate crystal polish may induce a very high resonant resistance) or the cut-off of quartz crystal $X_{L1}$ is inadequate (i.e wherein the bordering frequency signal is disabled), resonant resistance will be very high, i.e. higher than 50 ohms, thereby making it difficult to initiate oscillation.

Additionally, at these high frequencies, the parasitic capacitance and the bypass capacitance of the clock generator circuit have an even greater negative effect on the stability of the circuit than do inverters $A_1$, $A_2$ and quartz crystal $X_{L1}$, especially if a plurality of clock generators placed together are oscillating simultaneously. Therefore, it is important that resistor $R_f$, capacitors $C_o$ and $C_i$, and quartz crystal $X_{L1}$ are properly configured in the design of the device.

During mass production, the characteristics of the materials used to produce each new batch of devices are different. Thus, values for resistor $R_f$ and capacitors $C_o$ and $C_i$ must frequently be adjusted for each batch of devices to ensure a reliable clock generator circuit. This continual adjustment results in a needless waste of manpower, materials, and time. At the same time, this adjustment makes quality assurance standards difficult to maintain. Frequently, failure to meet quality assurance standards results in irreparable harm to a product's image. Another quality problem arises because resistors and capacitors are frequently susceptible to changes in weather, particularly, temperature and to dust, thereby changing the oscillation characteristics and the stability of the entire clock generator circuit. Preventing the above problems poses many serious difficulties in designing and manufacturing of the circuit.

Another prior art single-frequency clock generator is shown in FIG. 1B. Note that clock generator 35, similar to clock generator 32 illustrated in FIG. 1A, has limitations during high frequency oscillation. Specifically, clock generator 35 is limited by the physical characteristics of the transistor $Q_1$, and the quartz crystal $X_{L1}$. Thus, clock generator 35 has many of the same disadvantages inherent in clock generator 32 described above in detail.

Many electronics products on the market, such as video graphics arrays (VGAs) require different clock frequencies for each of their different functions. Thus, VGAs often require up to four clock generators to provide the necessary frequencies. FIG. 1C shows a schematic circuit diagram of the clock generator shown in FIG. 1A in a VGA application. Clocks generators 32A, 32B, 32C and 32D each provide a different frequency via lines 36 to VGA chip 37. In one example, crystals $X_{L1A}$, $X_{L1B}$, $X_{L1C}$ and $X_{L1D}$ provide a frequency of 50.35 MHz, 28.322 MHz, 44.9 MHz, and 36.0 MHz, respectively. In the above example, resistors $R_{fA}$ and $R_{fC}$ provide a resistance of 2K Ohm while resistors $R_{fb}$ and $R_{fd}$ provide a resistance of 5.1k Ohm and 3.6k Ohms, respectively. Additionally, capacitors $C_{iA}$, $C_{oA}$, $C_{oB}$, $C_{iC}$, $C_{oC}$, and $C_{oD}$ have a capacitance of 10 picofarads, whereas capacitors $C_{iB}$ and $C_{iD}$ have a capacitance of 30 picofarads. As shown in FIG. 1C, VGA chip 37 is coupled to 24 components. A few illustrative examples of VGAs requiring multiple clock generators are Model W86875 VGA chip manufactured by Winbond Electronics Corp. and Model WD 90C11 VGA chip manufactured by Western Digital.

In a multiple clock generator configuration, the interference between the clock generators caused by the coupling effect from different frequencies, the distribution of parasitic capacitance that causes distortion, and the accumulated noise have a significant effect on the entire clock generator circuit and make quality control during production very difficult. Therefore a need arises for a high frequency clock generator which (1) allows for selection between various frequencies, (2) permits use of different frequencies at the same time, (3) reduces the interference between a plurality of clock oscillation circuits, (4) minimizes external factors which may degrade performance, and (5) eliminates problems in mass production.

SUMMARY OF THE INVENTION

In accordance with the present invention, a clock generator includes a plurality of clock oscillator circuits, wherein each clock oscillator circuit is provided with a predetermined oscillation frequency. In one embodiment, output lines from the clock oscillator circuits are coupled to the input pads of a multiplexer which allows for multiple frequency selection. In another embodiment, output lines are coupled to a plurality of multiplexers which allows for multiple frequencies to be used at the same time. The clock oscillator circuits and the multiplexer(s) are fabricated as an integrated circuit, thereby dramatically decreasing the effects of external factors, such as dust and weather, which would otherwise degrade generator performance, reducing the area required for a circuit thereby increasing the potential density of a circuit, increasing the precision of setting the inverter bandwidth product and the capacitive value of each clock oscillator circuit, and increasing the stability of the clock generator.

DETAILED DESCRIPTION

Figure 1A:
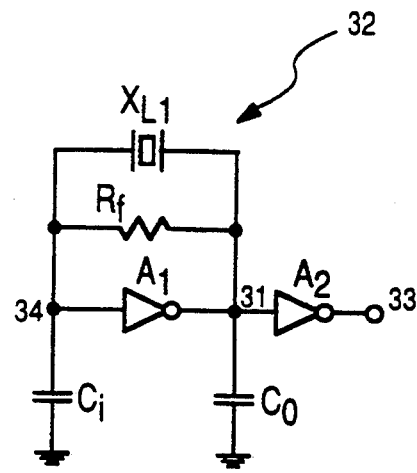
FIGS. 1A and 1B illustrate schematic circuit diagrams for typical clock generators.
Figure 1B:
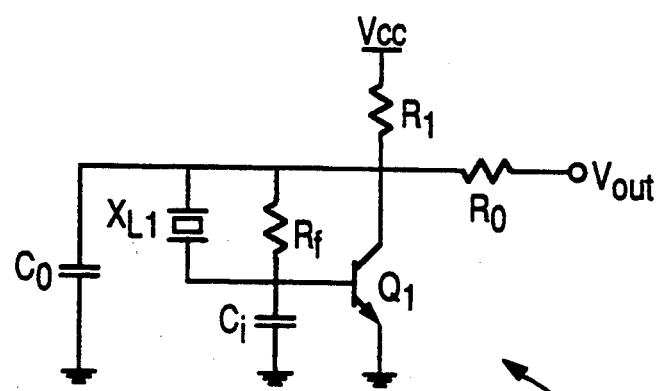
Figure 1C:
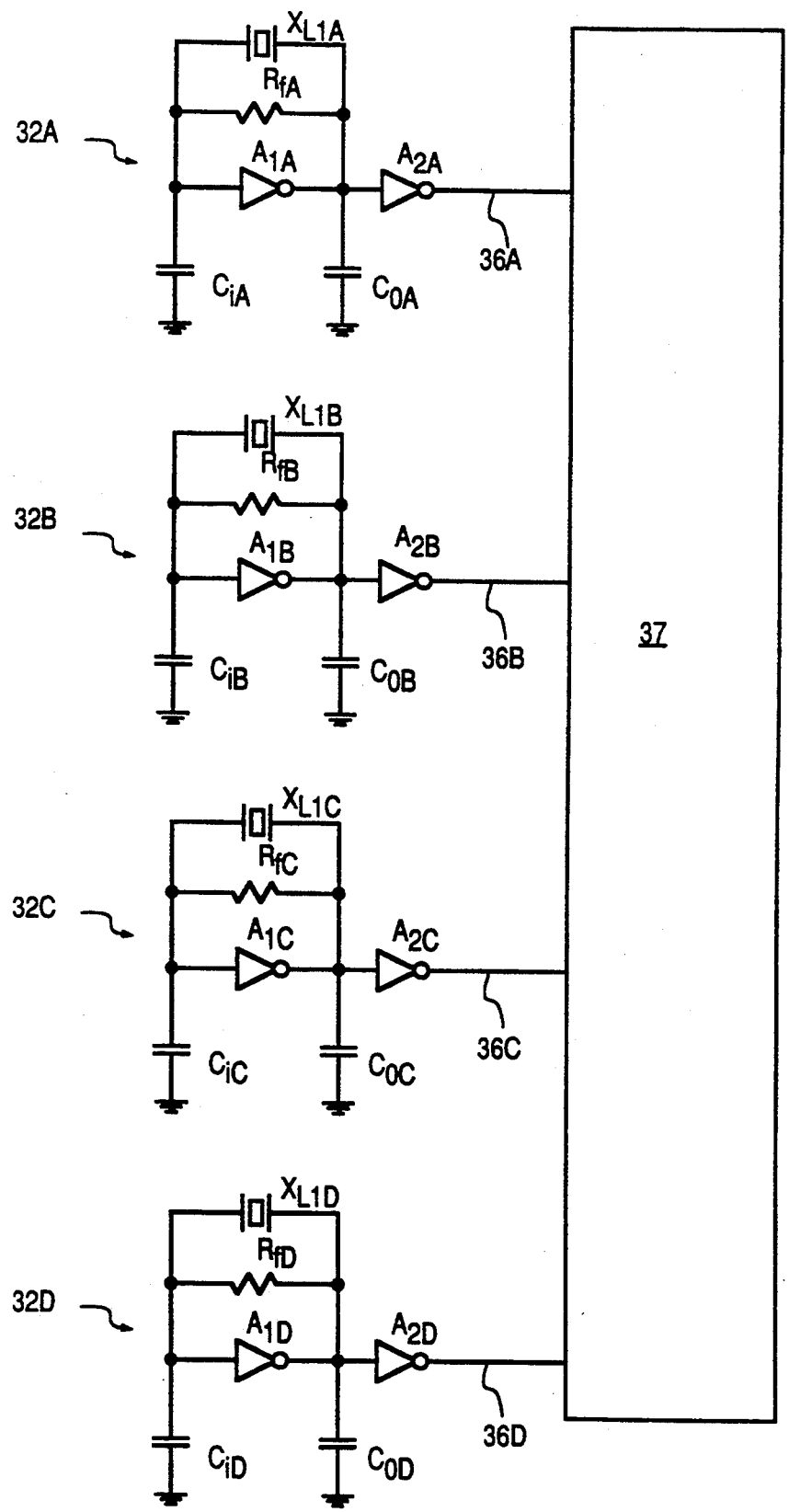
FIG. 1C shows a schematic circuit diagram of the clock generator shown in FIG. 1A in a VGA application.
Figure 2:
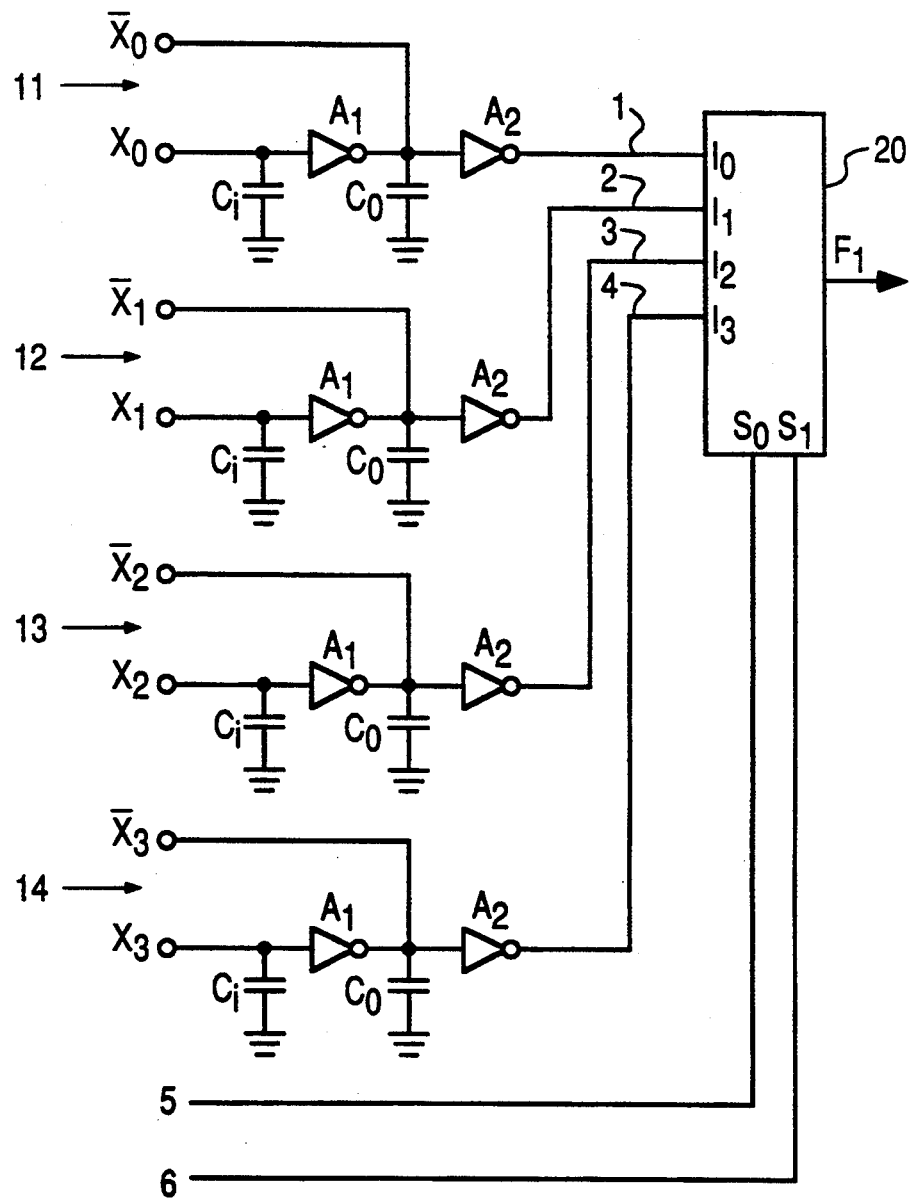
FIG. 2 illustrates a schematic circuit diagram of one embodiment of the present invention utilizing one multiplexer to produce an output clock signal from one of four input clock signals.
Figure 4:
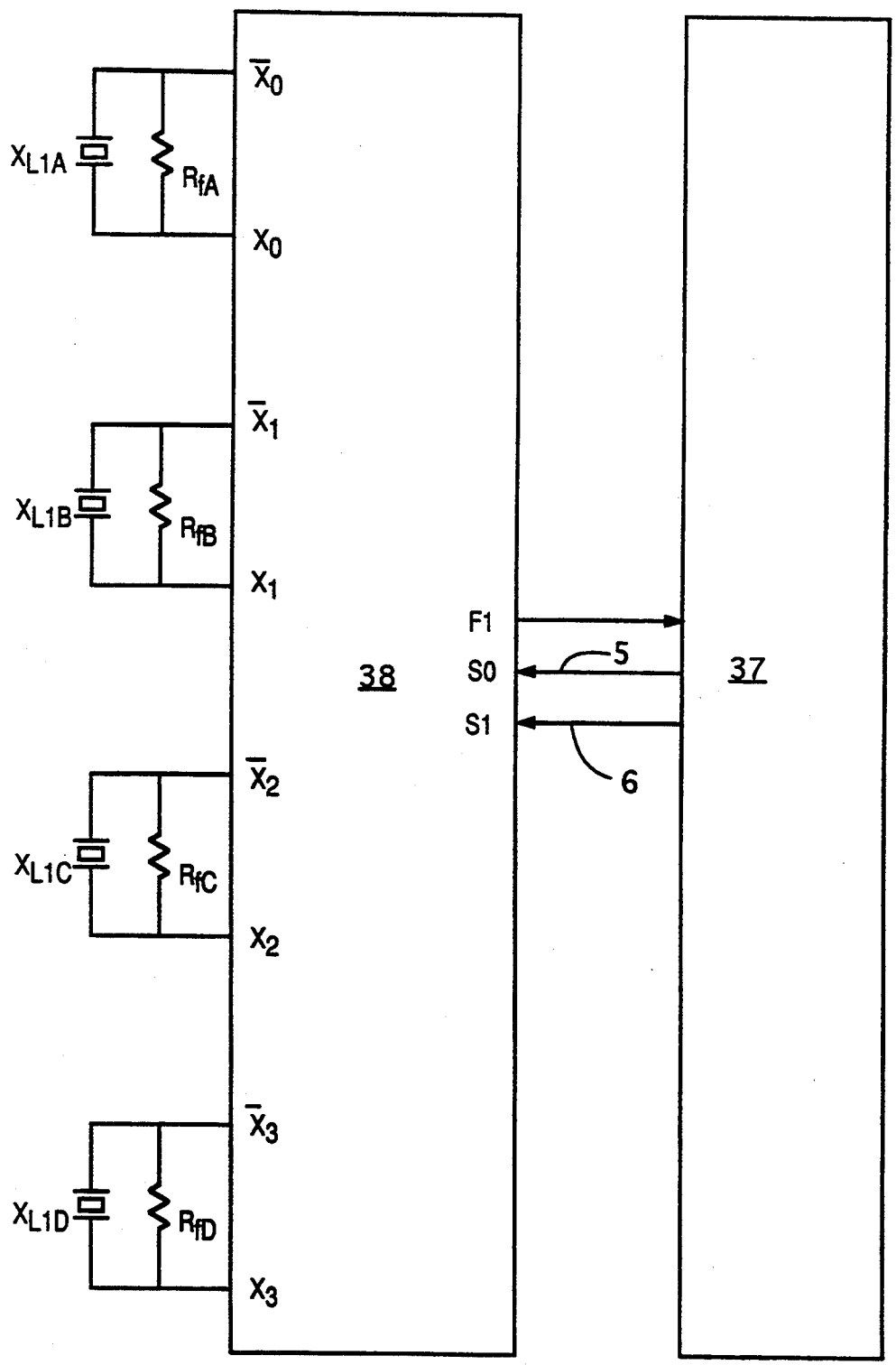
FIG. 4 illustrates a schematic circuit diagram of a clock generator in accordance with the present invention in a VGA application.

FIG. 2 illustrates a schematic circuit diagram of a portion of a clock generator in accordance with the present invention. This clock generator comprises four oscillator circuits 11, 12, 13, and 14, and one multiplexer 20. Each oscillator circuit includes capacitors $C_i$ and $C_o$, and inverters $A_1$ and $A_2$. Lines $X_n$ and $\overline{X}_n$ (where n identifies the nth oscillator circuit and n is an integer given by $0 \leq n \leq 3$) are connected to an external crystal and resistor in a configuration as shown in FIG. 1A to complete the circuit. Thus, referring to FIG. 4, crystal $X_{L1A}$ and resistor $R_{fA}$ are connected in parallel to lines $\overline{X}_o$ and $X_o$, crystal $X_{L1B}$ and resistor $R_{fB}$ are connected in parallel to lines $\overline{X}_1$ and $X_1$, crystal $X_{L1C}$ and resistor $R_{fC}$ are connected in parallel to lines $\overline{X}_2$ and $X_2$, and crystal $X_{L1D}$ and resistor $R_{fD}$ are similarly connected in parallel to lines $\overline{X}_3$ and $X_3$. Oscillator circuits 11, 12, 13 and 14 and multiplexer 20 comprise integrated circuit 38 which is coupled to VGA chip 37. As shown in FIG. 4, a clock generator in accordance with the present invention includes only nine components in comparison with the prior art clock generator which requires 24 components (FIG. 1C). Thus, the present invention simplifies the clock generator circuit by significantly reducing the number of required components.

In this embodiment and referring back to FIG. 2, multiplexer 20 is a 4 to 1 multiplexer with four input pads (i.e. terminals), $I_0$, $I_1$, $I_2$, and $I_3$, select pins $S_0$ and $S_1$, and output pad $F_l$. The output lines 1, 2, 3, and 4 from oscillator circuits 11, 12, 13, and 14 are connected to input pads $I_0$, $I_1$, $I_2$, and $I_3$, respectively, on multiplexer 20. Thus, a binary address, applied to select pins $S_0$ and $S_1$ via lines 5 and 6, provides for multiple frequency selection between oscillator circuits 11-14.

Fabricating inverters $A_1$, $A_2$, capacitors $C_i$, $C_o$, and multiplexer 20 in each oscillator circuit as an integrated circuit allows for high precision in setting the inverter bandwidth product and the values of the capacitors. This high precision reduces the effects of parasitic capacitance, thereby enhancing production yields. Moreover, integrated circuit construction minimizes the effects of external factors, such as weather and dust, which would otherwise degrade the performance of the generator. Additionally, integrated circuit fabrication provides high density capability, thereby reducing the area on a circuit board required for the oscillator. This miniaturization lowers manufacturing cost and enhances production yield.

By utilizing a multiplexer, the present invention reduces the number of output drivers on the integrated circuit, thereby increasing the efficiency of the oscillation circuit. A multiplexer also reduces the accumulation of noise and shortens the circuit length over which the multiple clock signals are transmitted on the break board or PC board, as well as shortening the circuit length within the integrated circuit. Thus, the area of the circuit layout is reduced, in addition to reducing the possibility of cross-talk arising between multiple clock signals.

The present invention also simplifies the process of designing a clock generator because all capacitors and inverters are standardized. Hence, the user need only select a suitable quartz crystal and a corresponding resistance for each oscillator circuit in order to complete a high stability oscillation circuit which provides multiple oscillation frequencies. Using this construction, bandwidths from 2 MHz to 50 MHz may be produced, making this device a true general-purpose oscillator.

Figure 3:
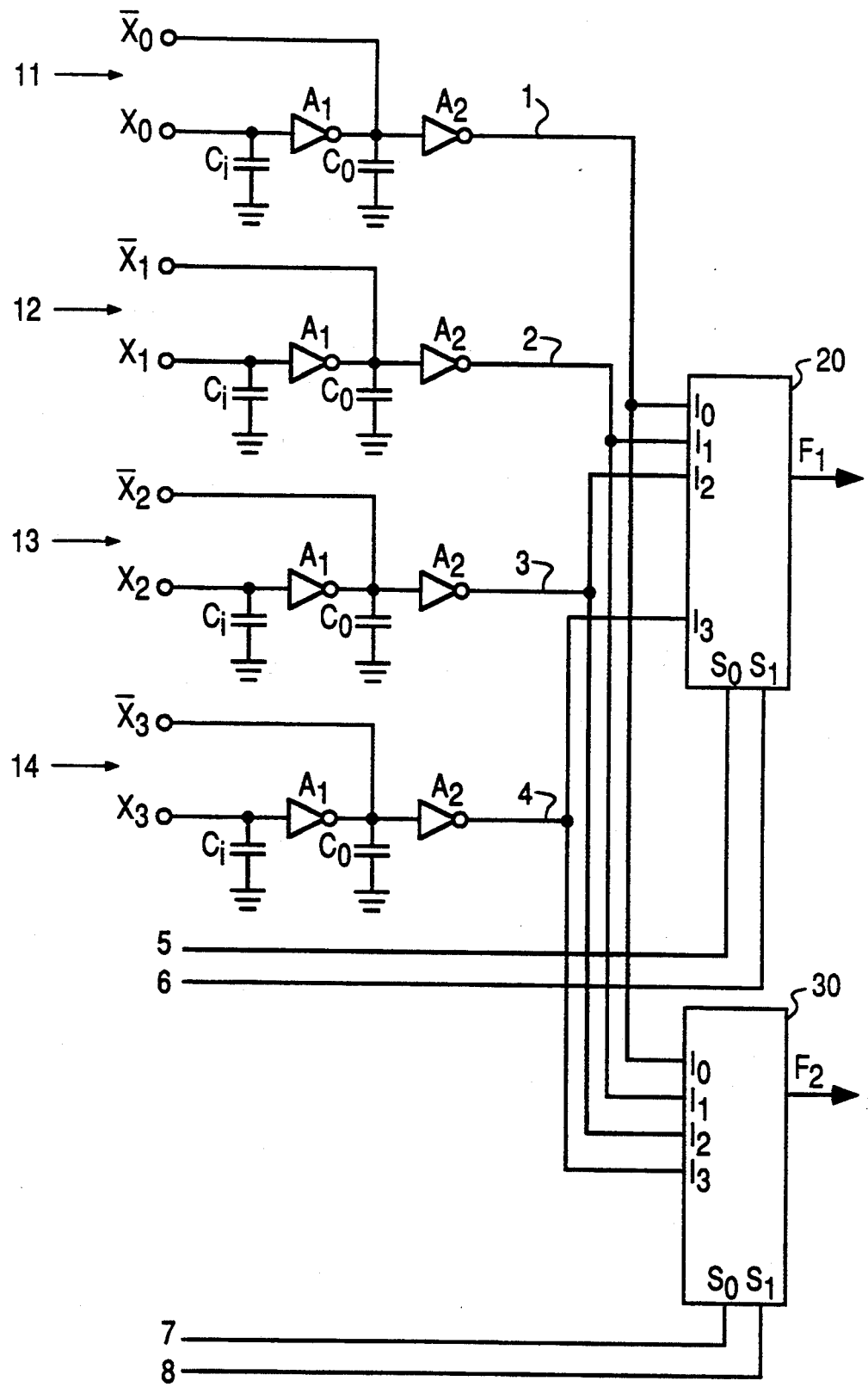
FIG. 3 shows a schematic circuit diagram of another embodiment of the present invention utilizing two multiplexers to produce two clock output signals simultaneously from four input clock signals.
Figure 5:
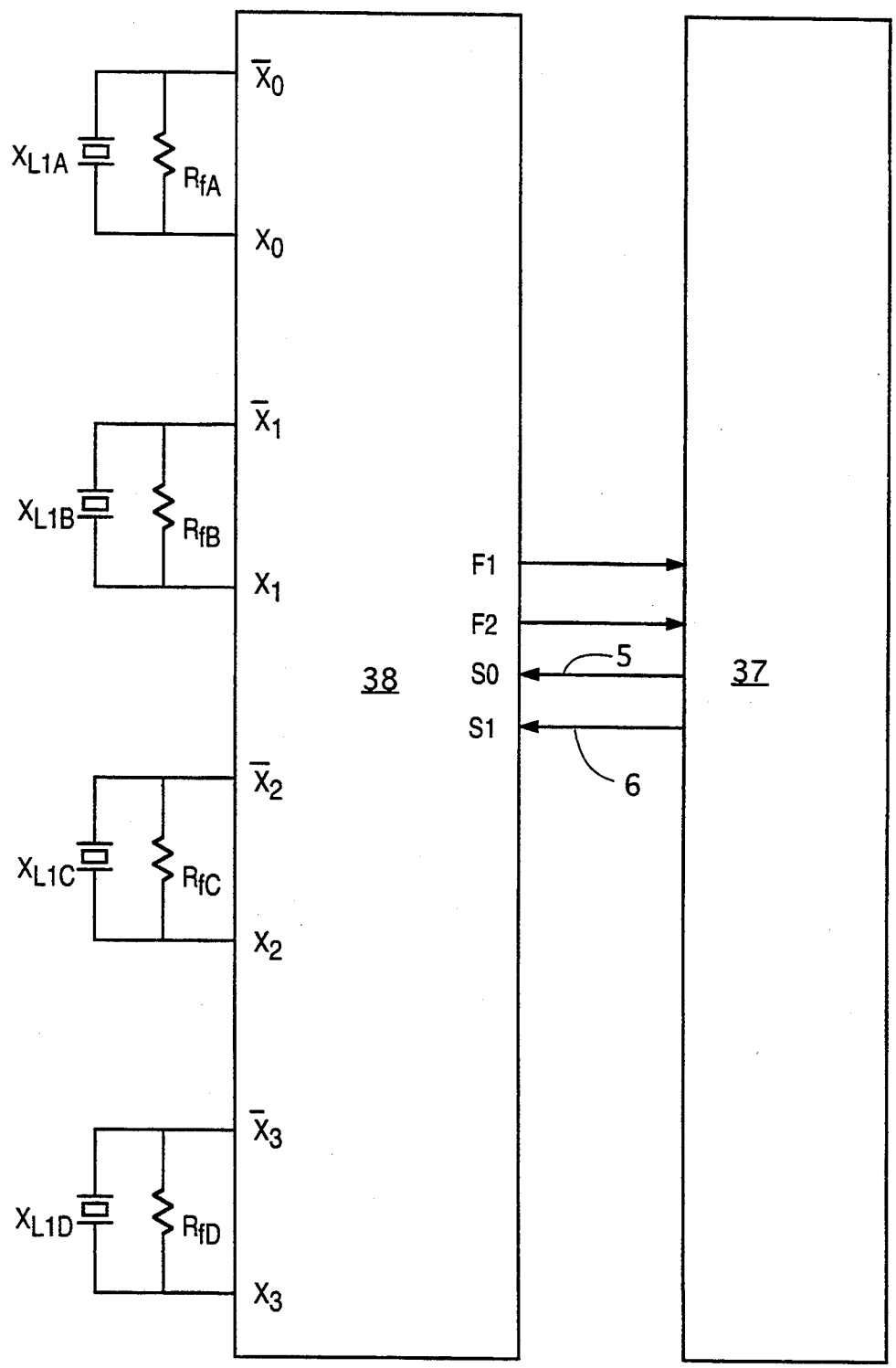
FIG. 5 illustrates a schematic circuit diagram similar to FIG. 4 of a clock generator that utilizes two multiplexers as illustrated in FIG. 3.

In another embodiment shown in FIG. 3, output lines 1, 2, 3, and 4 from oscillator circuits 11, 12, 13, and 14, respectively, are connected to input pads of both multiplexer 20 and multiplexer 30. A binary address, transferred to select pins $S_0$ and $S_1$ of multiplexer 30 on lines 7 and 8, selects either the same oscillator circuit as multiplexer 20 or a different oscillator circuit. In this manner, the second multiplexer 30 when used with the first multiplexer 20 allows two oscillator frequencies to be selected at the same time as illustrated in FIG. 5, thereby expanding the potential range of functions and enhancing the convenience of the clock generator.

The preceding description is meant to be illustrative only and not limiting. Those skilled in the art will be able to fabricate other devices in accordance with this invention based on the above description. In particular, a plurality of oscillator circuits can be provided on a semiconductor chip along with a multiplicity of two or more multiplexers. This will allow more than one output signal from the oscillators to be used in the integrated circuit or system of which this invention is a part. If the number of multiplexers equals the number of oscillators, then all output signals from the oscillators are capable of being used at one time.

We claim:
1. A high frequency clock generator comprising:
  a plurality of clock oscillator circuits, each of said clock oscillator circuits including an output termi- nal for transmitting an output clock signal from the clock oscillator circuit;

a first multiplexer comprising a plurality of input terminals coupled on a one-to-one basis to the plurality of output terminals of said plurality of clock oscillator circuits, said first multiplexer also comprising an output terminal providing an output clock signal at a first predetermined oscillation frequency; and a second multiplexer comprising a plurality of input terminals coupled on a one-to-one basis to the output terminals of said plurality of clock oscillator circuits, said second multiplexer also comprising an output terminal providing a second predetermined oscillation frequency, wherein said plurality of clock oscillator circuits and said first multiplexer and said second multiplexer are formed as an integrated circuit.

2. Structure of claim 1 wherein said plurality of input terminals of said first multiplexer comprises a plurality of input pads.

3. Structure of claim 1 wherein said first multiplexer further comprises means to select one of said plurality of clock oscillator circuits.

4. Structure of claim 1 wherein said first multiplexer is a multiple-to-one multiplexer.

5. Structure of claim 1 wherein said plurality of input terminals of said second multiplexer comprises a plurality of input pads.

6. Structure of claim 1 wherein said second multiplexer further comprises means to select one of said plurality of clock oscillator circuits.

7. Structure of claim 1 wherein said second multiplexer is a multiple-to-one multiplexer.

8. A high frequency clock generator including a plurality of oscillators, said clock generator comprising:

a plurality of clock oscillator circuits, each clock oscillator circuit having a pair of input lines and an output line, said pair of input lines coupled to one of said plurality of oscillators; and a plurality of multiplexers, each multiplexer comprising a plurality of input terminals, each of said input terminals of one of said multiplexers being coupled on a one-to-one basis to said output lines;

wherein said plurality of clock oscillator circuits and said plurality of multiplexers are formed as an integrated circuit.

9. Structure of claim 8 wherein said oscillator is a quartz crystal.

10. Structure of claim 8 where each of said plurality of multiplexers comprises a plurality of select pins and an output line.

11. Structure of claim 9 wherein the number of said plurality of oscillators is equal to the number of said multiplexers.

12. Structure of claim 9 wherein the number of said plurality of oscillators is greater than the number of said multiplexers.

13. A method of generating a clock signal comprising:

forming a plurality of crystal oscillator circuits as an integrated circuit, said crystal oscillator circuits generating a plurality of signals of predetermined frequencies, each of said crystal oscillator circuits comprising a pair of input lines;

connecting a plurality of quartz crystals on a one-to-one basis to said pair of input lines of each of said crystal oscillator circuits;

a first multiplexing step for multiplexing said plurality of signals to provide a first output signal; and a second multiplexing step simultaneously with said first multiplexing step for multiplexing said plurality of signals at the same time as said first output signal to provide a second output signal.

14. Method of claim 13 wherein said first multiplexing step comprises coupling one multiplexer to said plurality of crystal oscillators.

15. Method of claim 14 wherein each of said plurality of signals of said plurality of crystal oscillators generates a corresponding output signal having a predetermined frequency.

* * * * *